(12) United States Patent
Itou

(10) Patent No.: US 11,735,507 B2
(45) Date of Patent: *Aug. 22, 2023

(54) WIRING SUBSTRATE, ELECTRONIC DEVICE, AND ELECTRONIC MODULE

(71) Applicant: KYOCERA Corporation, Kyoto (JP)

(72) Inventor: Seiichirou Itou, Kyoto (JP)

(73) Assignee: Kyocera Corporation, Kyoto (JP)

( * ) Notice: Subject to any disclaimer, the term of this patent is extended or adjusted under 35 U.S.C. 154(b) by 243 days.

This patent is subject to a terminal disclaimer.

(21) Appl. No.: 17/417,798

(22) PCT Filed: Dec. 25, 2019

(86) PCT No.: PCT/JP2019/050973
§ 371 (c)(1),
(2) Date: Jun. 24, 2021

(87) PCT Pub. No.: WO2020/138221
PCT Pub. Date: Jul. 2, 2020

(65) Prior Publication Data
US 2022/0077045 A1   Mar. 10, 2022

(30) Foreign Application Priority Data

Dec. 26, 2018  (JP) ................ 2018-243283

(51) Int. Cl.
| H01L 23/13 | (2006.01) |
| H01L 23/498 | (2006.01) |
| H01L 23/544 | (2006.01) |
| H05K 1/02 | (2006.01) |
| H05K 1/18 | (2006.01) |

(52) U.S. Cl.
CPC ........ *H01L 23/49822* (2013.01); *H01L 23/13* (2013.01); *H01L 23/49833* (2013.01); *H01L 23/49838* (2013.01); *H01L 23/544* (2013.01); *H05K 1/0266* (2013.01); *H05K 1/181* (2013.01); *H01L 2223/54426* (2013.01)

(58) Field of Classification Search
CPC .................................. H01L 23/49822
USPC ........................................ 174/260
See application file for complete search history.

(56) References Cited

U.S. PATENT DOCUMENTS

| 9,609,743 B2 * | 3/2017 | Funahashi ............ H05K 3/403 |
| 2004/0212085 A1 | 10/2004 | Nomura et al. |
| 2015/0311154 A1 | 10/2015 | Sunohara |

FOREIGN PATENT DOCUMENTS

| EP | 2658355 A | 4/2013 |
| JP | 01-220884 A | 9/1989 |
| JP | 10-284436 A | 10/1998 |
| JP | 2000-312062 A | 11/2000 |
| JP | 2001-274548 A | 10/2001 |
| JP | 2014-157864 A | 8/2014 |
| JP | 2015-012157 A | 1/2015 |

* cited by examiner

*Primary Examiner* — Stanley Tso
(74) *Attorney, Agent, or Firm* — Volpe Koenig

(57) ABSTRACT

A wiring substrate includes a substrate, a first metal and a second metal. The substrate has a first surface, a second surface opposite the first surface, and a side surface connected to the first surface and the second surface. The first metal film is disposed so as to extend from the first surface to the side surface. The second metal film is disposed so as to extend from the second surface to the first metal film disposed on the side surface.

16 Claims, 4 Drawing Sheets

WIRING SUBSTRATE, ELECTRONIC DEVICE, AND ELECTRONIC MODULE

TECHNICAL FIELD

The present disclosure relates to a wiring substrate, an electronic device and an electronic module.

BACKGROUND

In JPH 10-284436 A, there is disclosed a technique of ohmically contacting a silicon carbide substrate and electrodes on the substrate. The ohmic contact is a resistive contact with no Schottky barrier present. Due to the ohmically-contacted electrodes, current can flow from the electrodes to the substrate in the same way that current flows through a metal resistor.

SUMMARY

A wiring substrate of the present disclosure includes:
a substrate having a first surface, a second surface opposite the first surface, and a side surface connected to the first surface and the second surface;
a first metal film disposed so as to extend from the first surface to the side surface; and
a second metal film disposed so as to extend from the second surface to over the first metal film disposed on the side surface.

An electronic device of the present disclosure includes:
the above wiring substrate; and
an electronic component mounted on the wiring substrate.

An electronic module of the present disclosure includes:
the above electronic device; and
a module board where the electronic device is mounted.

DETAILED DESCRIPTION

Hereinafter, an embodiment(s) of the present disclosure will be described in detail with reference to the drawings.

Figure 1:
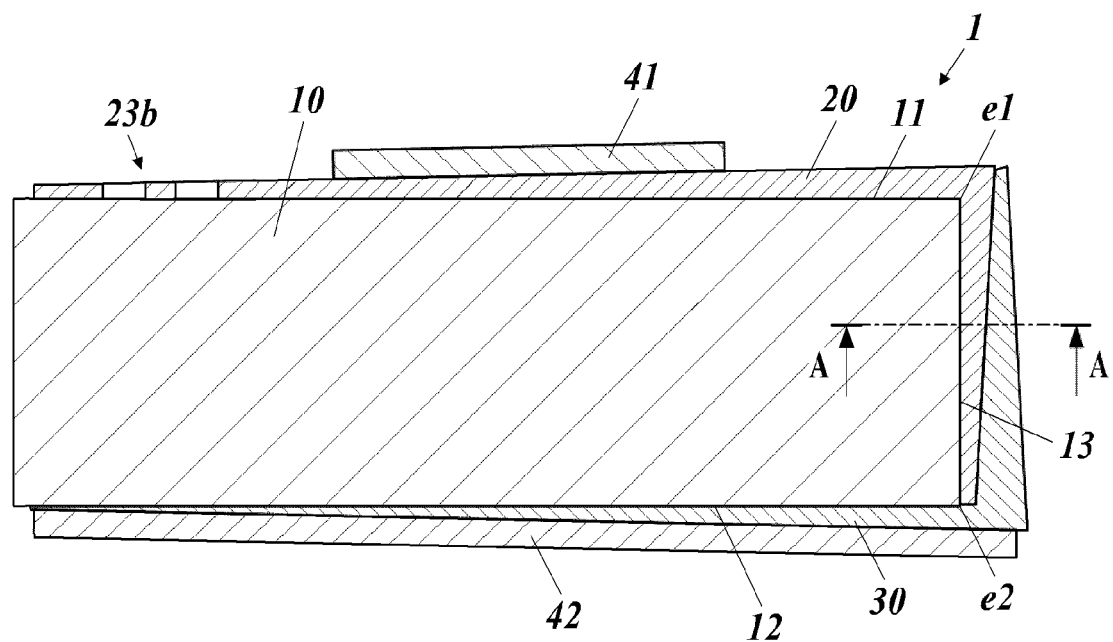
FIG. 1 is a vertical sectional view of a wiring substrate according to an embodiment(s) of the present disclosure.
Figure 2:
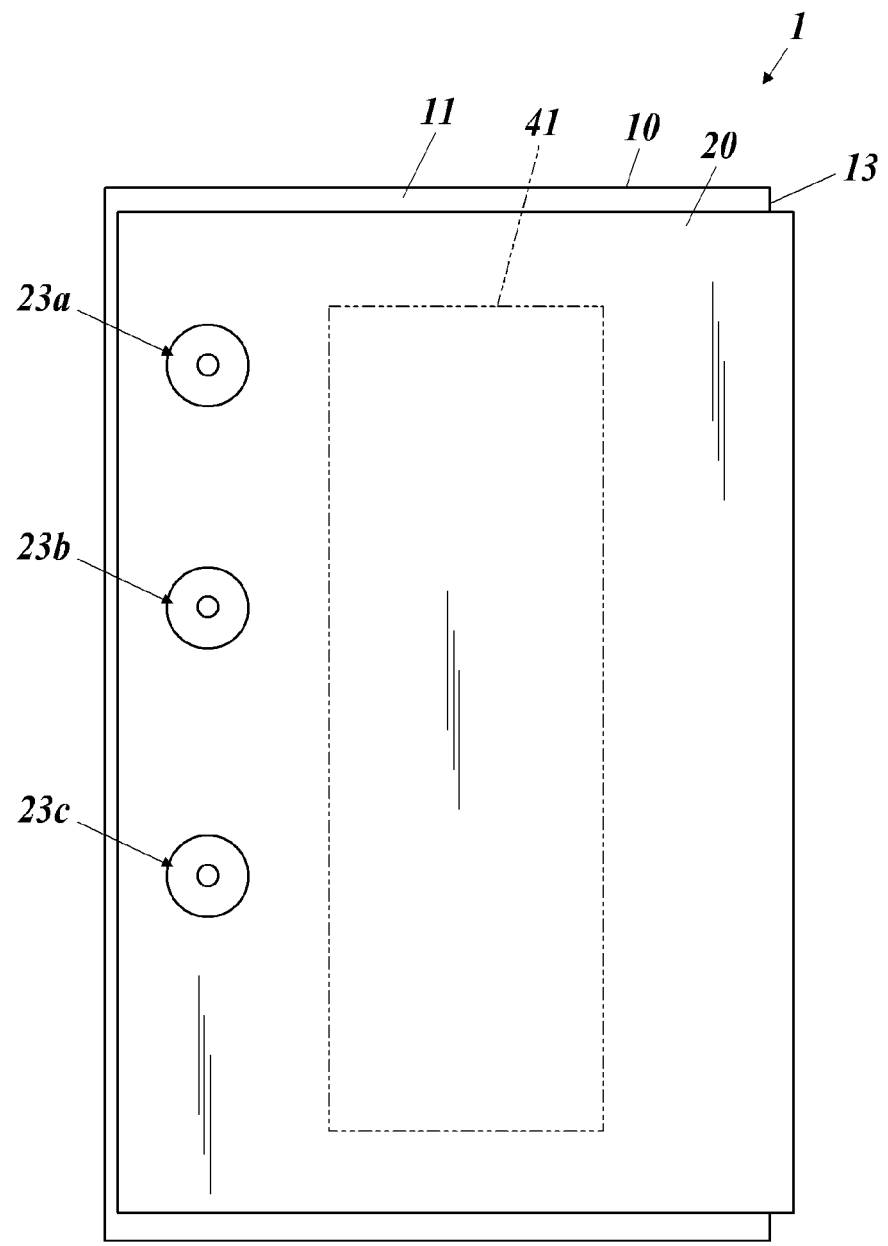
FIG. 2 is a plan view of the wiring substrate shown in FIG. 1.
Figure 3:
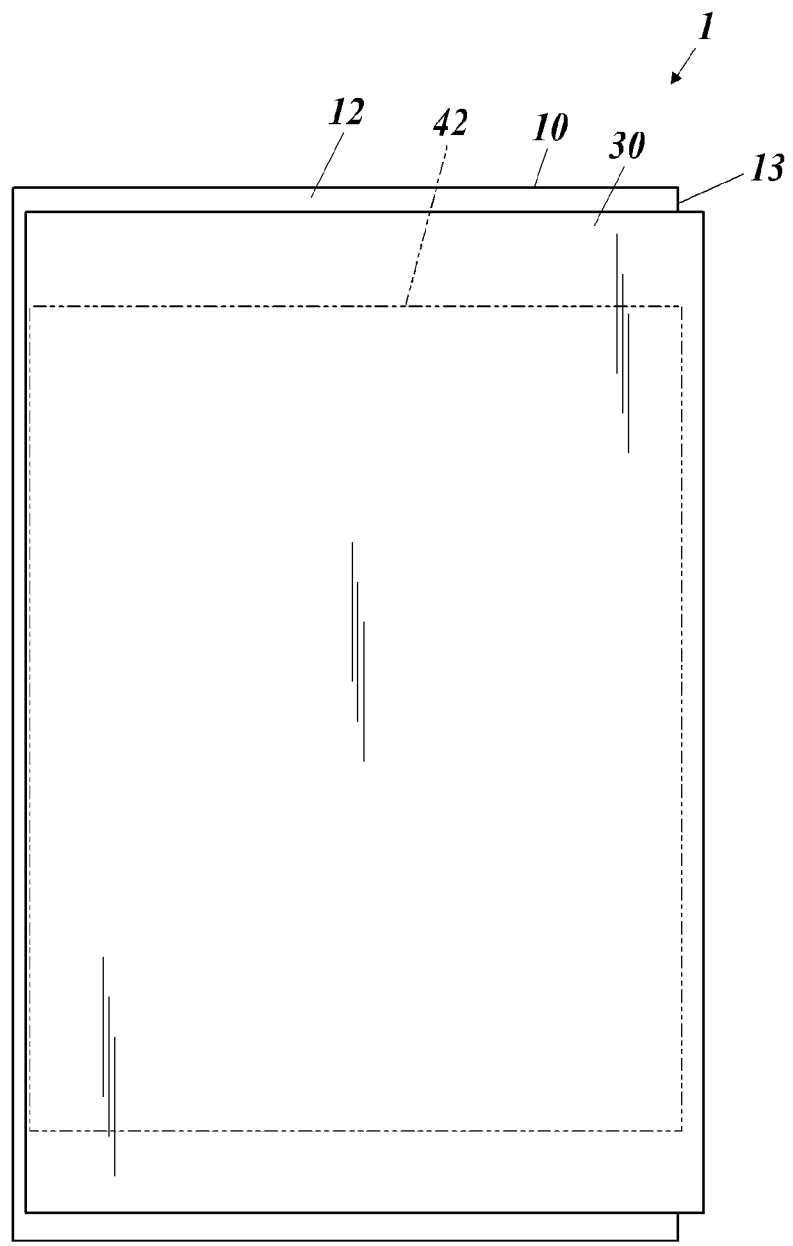
FIG. 3 is a bottom view of the wiring substrate shown in FIG. 1.
Figure 4:
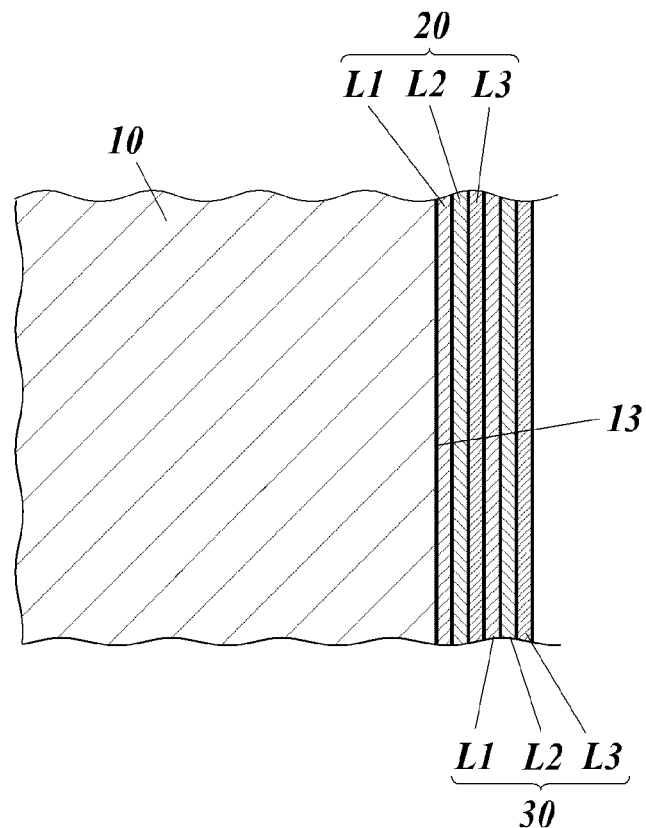
FIG. 4 is a sectional view taken along an arrowed line A-A shown in FIG. 1.

FIG. 1 is a vertical sectional view of a wiring substrate according to an embodiment(s) of the present disclosure. FIG. 2 is a plan view of the wiring substrate shown in FIG. 1. FIG. 3 is a bottom view of the wiring substrate shown in FIG. 1. FIG. 4 is a sectional view taken along an arrowed line A-A shown in FIG. 1. In FIG. 2 and FIG. 3, wiring conductors 41, 42 are represented by two-dot chain lines to show a state where the wiring conductors 41, 42 are removed.

A wiring substrate 1 of this embodiment is a submount for mounting an electronic component to a module board or in a package, and interposed between the electronic component and the mounting destination, for example. The wiring substrate 1 includes a substrate 10, a first metal film 20, a second metal film 30, and the wiring conductors 41, 42 that are film-shaped.

The substrate 10 is made of a semiconductor material, such as SiC (silicon carbide), or an insulating ceramic material, such as aluminum nitride or aluminum oxide. The substrate 10 has a first surface 11, a second surface 12 located opposite the first surface 11, and a side surface 13 connected to the first surface 11 and the second surface 12. The side surface 13 is located between one edge e1 (FIG. 1) of the first surface 11 and one edge e2 (FIG. 1) of the second surface 12. The edge e1 of the first surface 11 and the edge e2 of the second surface 12 are located on the same side. The side surface 13 may be a section generated by dicing.

The first metal film 20 is disposed so as to extend from the first surface 11 to the side surface 13. More specifically, the first metal film 20 on the first surface 11 and the first metal film 20 along the side surface 13 are integrally formed and continuous at the edge e1. The first metal film 20 disposed on the first surface 11 has a thickness gradient in which thickness increases toward the side surface 13. The first metal film 20 disposed on the side surface 13 has a thickness gradient in which thickness increases toward the first surface 11. Hence, the thickness of the first metal film 20 at the edge e1 is larger than the thickness of the first metal film 20 at its ends on the first surface 11 and the side surface 13 farthest away from the edge e1.

As shown in FIG. 4, the first metal film 20 is composed of an adhesive layer L1, a barrier layer L2 and a conductor layer L3 that are stacked on the substrate 10 in this order. The adhesive layer L1 is a metal having a higher degree of adhesion to the substrate 10 than the conductor layer L3, and Ti (titanium) may be used for example. The barrier layer L2 is a metal having a property of suppressing diffusion of components between layers, and Pt (platinum) may be used for example. The conductor layer L3 is a metal having a higher degree of electric conductivity than the adhesive layer L1, and Au (gold) may be used for example. Each or any of the adhesive layer L1, the barrier layer L2 and the conductor layer L3 of the first metal film 20 may have the above thickness gradients of the first metal film 20.

The second metal film 30 is disposed so as to extend from the second surface 12 to over the first metal film 20 disposed on the side surface 13. More specifically, the second metal film 30 on the second surface 12 and the second metal film 30 along the side surface 13 are integrally formed and continuous at the edge e2. The second metal film 30 disposed on the second surface 12 has a thickness gradient in which thickness increases toward the side surface 13. The second metal film 30 disposed over the side surface 13 has a thickness gradient in which thickness increases toward the second surface 12. Hence, the thickness of the second metal film 30 at the edge e2 is larger than the thickness of the second metal film 30 at its ends on the second surface 12 and the side surface 13 farthest away from the edge e2.

As shown in FIG. 4, the second metal film 30 is composed of an adhesive layer L1, a barrier layer L2 and a conductor layer L3 that are stacked on the substrate 10 in this order. Materials of the layers are the same as those of the layers of the first metal film 20. Each or any of the adhesive layer L1, the barrier layer L2 and the conductor layer L3 of the second metal film 30 may have the above thickness gradients of the second metal film 30.

The thickness gradient of the first metal film 20 along the side surface 13 and the thickness gradient of the second metal film 30 along the side surface 13 are opposite one another in direction, but may be substantially the same in magnitude. Hence, the combined thickness of the first metal film 20 and the second metal film 30 on the side surface 13 may be substantially uniform from the side near the edge e1 to the side near the edge e2. This configuration can uniformly diffuse Joule heat generated at the interface between the first metal film 20 and the second metal film 30 on the side surface 13 at the time of electrification, and reduce stress concentration that occurs in the first metal film 20 and the second metal film 30 on the basis of the Joule heat. In this application, the direction from the second surface 12 to the first surface 11 is referred to as height. The same applies hereinafter.

Further, the average thickness of the first metal film 20 along the side surface 13 and the average thickness of the second metal film 30 along the side surface 13 may be substantially the same. Still further, a length of the side surface 13 in the height direction, the length for which the first metal film 20 is formed, and a length of the side surface 13 in the height direction, the length for which the second metal film 30 is formed, may be substantially the same. For example, they may each be substantially the entire length of the substrate 10 in the height direction. This configuration can make the thickness of the first metal film 20 and the thickness of the second metal film 30 substantially the same at the center of the substrate 10 in the height direction, and hence can uniformize film stress that occurs in the first metal film 20 and the second metal film 30 on the side surface 13. In this application, the film stress includes stress that has been applied since the time of film forming (deposition) and stress that is generated by difference in coefficient of thermal expansion between the films and the substrate 10.

The wiring conductor 41 is a part where an electronic component is (to be) mounted and that is electrically connected to the electronic component, and is formed on the first surface 11 with the first metal film 20 in between. The other wiring conductor 42 is a part that is joined to the mounting destination, and is formed on the second surface 12 with the second metal film 30 in between. As the wiring conductors 41, 42, AuSz (gold tin) may be used for example. If AuSz is used as the material, barrier films made of Pt (platinum) or the like may be interposed between the wiring conductor 41 and the first metal film 20 and between the wiring conductor 42 and the second metal film 30.

In the drawing(s), the thickness gradient of the first metal film 20 on the first surface 11 and the thickness gradient of the second metal film 30 on the second surface 12 are exaggerated. The actual thickness gradients thereof are each about equal to parallelism tolerance of the first surface 11 and the second surface 12 of the substrate 10, and hence the degree of parallelism between the upper surface of the wiring conductor 41 and the lower surface of the wiring conductor 42 is relatively high, unlike that shown in the drawing(s).

As shown in FIG. 2, alignment marks 23a to 23c are formed in the first metal film 20 on the first surface 11. The alignment marks 23a to 23c are marks that are identified in an image taken by a camera or the like for adjusting the direction and position of the wiring substrate 1 if an electronic component is to be mounted on the wiring substrate 1 or if the wiring substrate 1 is to be mounted on the mounting destination. The alignment marks 23a to 23c are formed with a deposition pattern of the first metal film 20, and each include a portion having no metal film. The alignment marks 23a to 23c are formed by patterning for forming the first metal film 20 or by etching the first metal film 20.

The alignment marks 23a to 23c are arranged, on the first surface 11, farther away from the side surface 13 than the center of the first metal film 20 disposed on the first surface 11. The alignment marks 23a to 23c may be arranged, on the second surface 12, farther away from the side surface 13 than the center of the second metal film 30 disposed on the second surface 12. The alignment marks 23a to 23c may be arranged opposite the side surface 13 with the wiring conductor 41 in between.

<Manufacturing Method>

Next, a manufacturing method of the first metal film 20 and the second metal film 30 having the above thickness gradients will be described.

The first metal film 20 is formed by, for example, vapor deposition, sputtering or the like by using a vacuum deposition apparatus. The substrate 10 is arranged in the vacuum deposition apparatus such that the edge e1 faces a source of a deposition material. If the first surface 11 and the side surface 13 intersect at right angles, this arrangement inclines the first surface 11 and the side surface 13 by 45 degrees with respect to the source of the deposition component. A deposition process performed in the above arrangement can form the first metal film 20 that is thick at the edge e1 and is thinner at positions as the positions are far away from the edge e1. Similarly, regarding the second metal film 30 too, the substrate 10 is arranged in the vacuum deposition apparatus such that the edge e2 faces the source of the deposition component, and the deposition process performed in this arrangement can form the second metal film 30 having the above thickness gradients.

At the time of forming the first metal film 20 and at the time of forming the second metal film 30, a photoresist is applied to surfaces of the substrate 10 excluding the first surface 11, the second surface 12 and the side surface 13, so that metal films are not formed on these other surfaces. It is possible that the photoresist is also applied to, of the first surface 11, the second surface 12 and the side surface 13, edges adjacent to the other surfaces, and then the deposition process is performed.

<Electronic Device and Electronic Module>

Figure 5:
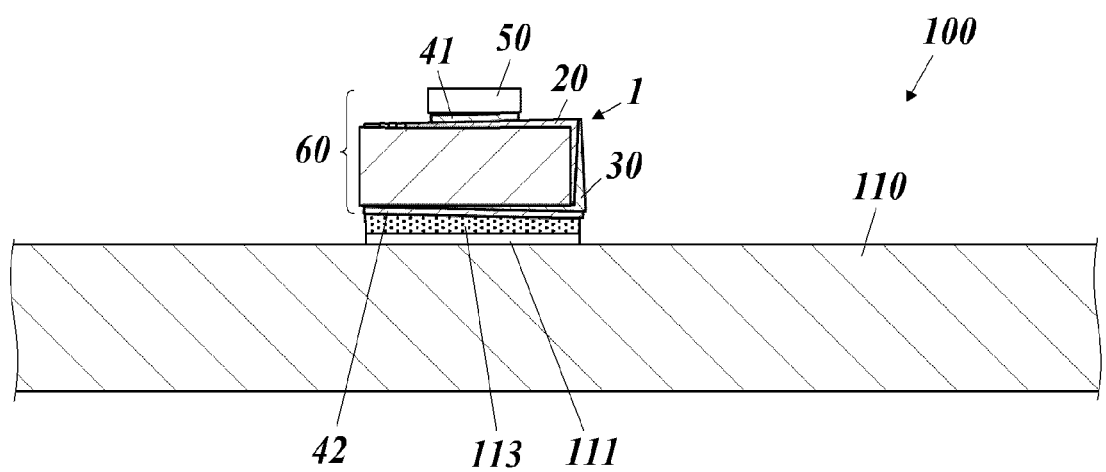
FIG. 5 is a vertical sectional view of an electronic device and an electronic module according to the embodiment of the present disclosure.

FIG. 5 is a sectional view of an electronic device and an electronic module according to this embodiment of the present disclosure.

An electronic device 60 of this embodiment is configured by mounting an electronic component 50 on the wiring substrate 1. Although not shown, the electronic device 60 may further include a package where the wiring substrate 1 and the electronic component 50 are housed.

As the electronic component 50, various electronic components are applicable, which include: optical elements, such as an LD (Laser Diode), a PD (Photo Diode) and an LED (Light Emitting Diode); imagers, such as a CCD (Charge Coupled Device) and a CMOS (Complementary Metal Oxide Semiconductor) device; piezoelectric vibrators, such as a crystal oscillator; surface acoustic wave devices; semiconductor devices, such as a semiconductor integrated circuit (IC) device; electric capacitors; inductors; and resistors.

The electronic component 50 may be connected to the wiring conductor 41 of the wiring substrate 1 via (with) a joining material, such as solder, or terminals of the electronic component 50 joined to the wiring substrate 1 may be electrically connected to the wiring conductor 41 via (with) bonding wires or the like.

An electronic module 100 of this embodiment is configured by mounting the electronic device 60 on a module board 110. On the module board 110, in addition to the electronic device 60, other electronic device(s), electronic element(s), electric element(s) and/or the like may be mounted. The module board 110 is provided with an electrode pad 111, and the electronic device 60 is joined to the electrode pad 110 via (with) a joining material 113, such as solder. In FIG. 5, the wiring conductor 42 of the wiring substrate 1 is joined to the electrode pad 111, but if the electronic device 60 has a package, a wiring conductor of the package may be joined to the electrode pad 111 of the module board 110.

As described above, according to the wiring substrate 1 of the embodiment, the first metal film 20 is disposed so as to extend from the first surface 11 to the side surface 13 of the substrate 10, and the second metal film 30 is disposed so as to extend from the second surface 12 to over the first metal film 20 disposed on the side surface 13 of the substrate 10. Hence, if current flows from the first surface 11 to the second surface 12 of the substrate 10, a large amount of the current flows through the first metal film 20 and the second metal film 30 on the side surface 13. This can suppress the Joule heat that is generated in the substrate 10 and, for example, in a case where heat dissipation of an electronic component mounted on the wiring substrate 1 is needed, enhance heat dissipation characteristics thereof through the substrate 10.

Further, according to the wiring substrate 1 of the embodiment, current can flow from the first surface 11 to the second surface 12 of the substrate 10 through the conductor(s). Electrical resistance of the first metal film 20 and the second metal film 30 is smaller than that of the substrate 10, which is a semiconductor, by four digits or more. Hence, according to the wiring substrate 1 of the embodiment, current can flow from the first surface 11 to the second surface 12 with a small loss, and generation of the Joule heat can be reduced significantly.

Further, on the side surface 13 of the substrate 10, the first metal film 20, which is present thereon so as to extend to the first surface 11, and the second metal film 30, which is present thereon so as to extend to the second surface 12, are stacked. This configuration produces an effect of suppressing separation of the first metal film 20 or the second metal film 30 from the side surface 13, for example, even if heat is applied to the wiring substrate 1 and stress occurs at the interface between the substrate 10 and the first metal film 20 or the second metal film 30 due to difference in coefficient of thermal expansion therebetween.

Further, according to the wiring substrate 1 of the embodiment, the first metal film 20 disposed on the first surface 11 has a thickness gradient in which thickness increases toward the side surface 13, and the first metal film 20 disposed on the side surface 13 has a thickness gradient in which thickness increases toward the first surface 11. Further, the second metal film 30 disposed on the second surface 12 has a thickness gradient in which thickness increases toward the side surface 13, and the second metal film 30 disposed over the side surface 13 has a thickness gradient in which thickness increases toward the second surface 12. These thickness gradients can enhance strength of the first metal film 20 and the second metal film 30 at the edges e1, e2, where stress is likely to concentrate, and suppress generation of cracks or the like in portions thereof at the edges e1, e2. Hence, low electrical resistance from the first surface 11 to the second surface 12 of the substrate 10 can be certainly maintained, and reliability of electrical characteristics can be enhanced.

Further, according to the wiring substrate 1 of the embodiment, the combined thickness of the first metal film 20 and the second metal film 30 on the side surface 13 can be uniform from the first surface 11 side to the second surface 12 side. This configuration can uniformly diffuse the Joule heat generated at the interface between the first metal film 20 and the second metal film 30 on the side surface 13 at the time of electrification, and reduce stress concentration that occurs in the first metal film 20 and the second metal film 30 on the basis of the Joule heat. Hence, low electrical resistance from the first surface 11 to the second surface 12 of the substrate 10 can be certainly maintained, and reliability of electrical characteristics can be enhanced.

Further, according to the wiring substrate 1 of the embodiment, the thickness of the first metal film 20 and the thickness of the second metal film 30 can be substantially the same at the center of the substrate 10 in the height direction. This configuration can uniformize, in the height direction, film stress that occurs in the first metal film 20 and the second metal film 30 on the side surface 13, and the uniformity of the film stress can further suppress separation of the first metal film 20 or the second metal film 30.

Further, according to the wiring substrate 1 of the embodiment, each of the first metal film 20 and the second metal film 30 includes the adhesive layer L1, the barrier layer L2 and the conductor layer L3. Hence, on the first surface 11 where the first metal film 20 is present alone and the second surface 12 where the second metal film 30 is present alone, the first metal film 20 and the second metal film 30 are highly stable. Further, on the side surface 13 where the first metal film 20 and the second metal film 30 are present by lying on top of one another too, the first metal film 20 and the second metal film 30 are highly stable by each having the three-layer structure.

Further, according to the wiring substrate 1 of the embodiment, the alignment marks 23a to 23c are arranged away from the side surface 13. Due to this arrangement, the alignment marks 23a to 23c do not narrow the section of the main current path from the first metal film 20 on the first surface 11 to the second metal film 30 on the second surface 12. Hence, current can flow from the first metal film 20 on the first surface 11 to the second metal film 30 on the second surface 12 with a small loss, and the Joule heat that is generated in the first metal film 20 and the second metal film 30 can be further reduced.

Further, according to the electronic device 60 and the electronic module 100 of the embodiment, since generation of the Joule heat in the substrate 10 of the wiring substrate 1 is reduced, heat dissipation of the electronic component 50 can be enhanced. Hence, reliability of the electronic device 60 and the electronic module 100 can be enhanced.

In the above, an embodiment(s) of the present disclosure has been described. Although in the above embodiment, a semiconductor is cited as an example of the material of the substrate, the substrate may be made of an insulating material. Further, although in the above embodiment, the first metal film and the second metal film are formed in nearly the entire area of the side surface of the wiring substrate in the height direction, the first metal film and the second metal film may be stacked on top of one another only at a portion(s) of the side surface in the height direction. Still further, although in the above embodiment, the first metal film and the second metal film each have a three-layer structure, they each may have not a three-layer structure but another multilayer structure or have a single-layer structure, and also the material of each layer can be changed as appropriate. Yet further, although in the above embodiment, a surface where an electronic component is (to be) mounted is the first surface, the surface where an electronic component is (to be) mounted may be the second surface. That is, the stacking order of the metal films on the side surface may be reversed from the stacking order shown in FIG. 1. The description of the embodiment is illustrative in every aspect, and hence the present invention is not limited thereto. The present disclosure is also applicable to the embodiment subjected to appropriate combination, change, replacement, addition, omission and/or the like of aspect(s) as far as there is no inconsistency. It is appreciated that not-shown numerous modifications can be envisaged without departing from the scope of the present invention.

INDUSTRIAL APPLICABILITY

The present disclosure is applicable to a wiring substrate, an electronic device and an electronic module.

The invention claimed is:

1. A wiring substrate comprising:
a substrate having a first surface, a second surface opposite the first surface, and a side surface connected to the first surface and the second surface;
a first metal film disposed so as to extend from the first surface to the side surface; and
a second metal film disposed so as to extend from the second surface to over the first metal film disposed on the side surface,
wherein the first metal film disposed on the first surface has a thickness gradient in which thickness increases toward the side surface,
wherein the first metal film disposed on the side surface has a thickness gradient in which thickness increases toward the first surface,
wherein the second metal film disposed on the second surface has a thickness gradient in which thickness increases toward the side surface, and
wherein the second metal film disposed over the side surface has a thickness gradient in which thickness increases toward the second surface.

2. The wiring substrate according to claim 1, wherein each of the first metal film and the second metal film includes an adhesive layer, a barrier layer and a conductor layer.

3. The wiring substrate according to claim 2, comprising an alignment mark at a position on the first surface farther away from the side surface than a center of the first metal film disposed on the first surface or at a position on the second surface farther away from the side surface than a center of the second metal film disposed on the second surface.

4. An electronic device comprising:
the wiring substrate according to claim 3; and
an electronic component mounted on the wiring substrate.

5. An electronic device comprising:
the wiring substrate according to claim 2; and
an electronic component mounted on the wiring substrate.

6. The wiring substrate according to claim 1, comprising an alignment mark at a position on the first surface farther away from the side surface than a center of the first metal film disposed on the first surface or at a position on the second surface farther away from the side surface than a center of the second metal film disposed on the second surface.

7. An electronic device comprising:
the wiring substrate according to claim 6; and
an electronic component mounted on the wiring substrate.

8. An electronic device comprising:
the wiring substrate according to claim 1; and
an electronic component mounted on the wiring substrate.

9. An electronic module comprising:
the electronic device according to claim 8; and
a module board where the electronic device is mounted.

10. The wiring substrate according to claim 1, wherein each of the first metal film and the second metal film includes an adhesive layer, a barrier layer and a conductor layer.

11. The wiring substrate according to claim 10, comprising an alignment mark at a position on the first surface farther away from the side surface than a center of the first metal film disposed on the first surface or at a position on the second surface farther away from the side surface than a center of the second metal film disposed on the second surface.

12. An electronic device comprising:
the wiring substrate according to claim 11; and
an electronic component mounted on the wiring substrate.

13. An electronic device comprising:
the wiring substrate according to claim 10; and
an electronic component mounted on the wiring substrate.

14. The wiring substrate according to claim 1, comprising an alignment mark at a position on the first surface farther away from the side surface than a center of the first metal film disposed on the first surface or at a position on the second surface farther away from the side surface than a center of the second metal film disposed on the second surface.

15. An electronic device comprising:
the wiring substrate according to claim 14; and
an electronic component mounted on the wiring substrate.

16. An electronic device comprising:
the wiring substrate according to claim 1; and
an electronic component mounted on the wiring substrate.

* * * * *